United States Patent
Menon et al.

(10) Patent No.: US 6,817,640 B2
(45) Date of Patent: Nov. 16, 2004

(54) FOUR-BAR LINKAGE WAFER CLAMPING MECHANISM

(75) Inventors: Venugopal Menon, Redwood City, CA (US); Damon Keith Cox, Round Rock, TX (US)

(73) Assignee: Applied Materials, Inc., Santa Clara, CA (US)

( * ) Notice: Subject to any disclaimer, the term of this patent is extended or adjusted under 35 U.S.C. 154(b) by 176 days.

(21) Appl. No.: 09/896,056

(22) Filed: Jun. 28, 2001

(65) Prior Publication Data

US 2003/0001535 A1 Jan. 2, 2003

(51) Int. Cl.[7] .............................................. B25J 15/08
(52) U.S. Cl. .................. 294/103.1; 294/1.1; 414/744.5; 414/941; 901/31; 901/39
(58) Field of Search ............................... 294/1.1, 103.1, 294/104, 116; 414/744.5, 935, 941; 901/15, 31, 36, 39; 318/568.11, 568.21

(56) References Cited

U.S. PATENT DOCUMENTS

| | | | | | |
|---|---|---|---|---|---|
| 5,133,635 | A | * | 7/1992 | Malin et al. ................ 294/104 |
| 5,447,409 | A | * | 9/1995 | Grunes et al. ................ 901/15 |
| 5,469,035 | A | * | 11/1995 | Lowrance ................... 901/15 |
| 5,810,935 | A | * | 9/1998 | Lee et al. .................... 901/39 |
| 5,951,770 | A | * | 9/1999 | Perlov et al. ............... 414/941 |
| 5,955,858 | A | * | 9/1999 | Kroeker et al. ............. 901/31 |
| 6,132,165 | A | * | 10/2000 | Carducci ................. 414/744.5 |
| 6,155,773 | A | * | 12/2000 | Ebbing et al. ........... 294/103.1 |
| 6,166,509 | A | * | 12/2000 | Wyka et al. ........... 318/568.16 |
| 6,216,883 | B1 | | 4/2001 | Kobayashi et al. .......... 414/941 |
| 6,222,337 | B1 | * | 4/2001 | Kroeker et al. ........ 318/568.11 |
| 6,283,701 | B1 | * | 9/2001 | Sundar et al. ........... 414/744.5 |
| 6,322,312 | B1 | * | 11/2001 | Sundar ................... 414/744.5 |
| 6,435,807 | B1 | * | 8/2002 | Todorov et al. ............ 414/941 |
| 6,623,235 | B2 | * | 9/2003 | Yokota et al. ................ 901/39 |
| 2003/0094824 | A1 | * | 5/2003 | Cox et al. .................... 294/104 |

FOREIGN PATENT DOCUMENTS

| | | | |
|---|---|---|---|
| EP | 0820090 | * | 7/1997 |
| EP | 0858866 | * | 2/1998 |
| EP | 1041604 A2 | | 10/2000 |
| JP | 62146805 | | 6/1987 |
| JP | 62299044 | | 12/1987 |
| JP | 2000158337 | | 6/2000 |

* cited by examiner

*Primary Examiner*—Paul Chin
(74) *Attorney, Agent, or Firm*—Dugan & Dugan

(57) ABSTRACT

The wafer clamping mechanism comprises a linkage mechanism and a wafer contact point coupled to the linkage mechanism. The linkage mechanism includes a four-bar linkage having: a first link having a first fixed pivot and a first floating pivot remote from the first fixed pivot; a second link having a second fixed pivot and a second floating pivot remote from the second fixed pivot; and a third link having a first coupling pivot rotatably coupled to the first floating pivot, and having a second coupling pivot rotatably coupled to the second floating pivot. In use motion of the linkage mechanism causes the wafer contact point to clamp a wafer.

19 Claims, 9 Drawing Sheets

FOUR-BAR LINKAGE WAFER CLAMPING MECHANISM

TECHNICAL FIELD

The present invention relates to a clamping mechanism for securing a semiconductor wafer during wafer handling. More particularly, the present invention is directed to a four bar linkage mechanism that securely clamps a semiconductor wafer near the distal end of a robot arm.

BACKGROUND OF THE INVENTION

A wafer is the base material, usually silicon, used in semiconductor chip or integrated circuit fabrication. Typically, the wafer is a thin slice of base material cut from an ingot or "boule." Each 8 inch (200 mm) production wafer is approximately 1/30 inches (0.85 mm) thick and has a diameter that varies by ±1 mm. Because of the nature of the base material and the thinness of each slice, the wafer can easily be damaged through mishandling.

Wafers are typically processed into semiconductor chips by sequentially exposing each wafer to a number of individual processes, such as photo masking, etching and implantation. Modem semiconductor processing systems include cluster tools that aggregate multiple chambers together, where one or more of the individual processes are performed in each chamber. These chambers may include, for example, degas chambers, substrate pre-conditioning chambers, cool down chambers, transfer chambers, chemical vapor deposition chambers, physical vapor deposition chambers, etch chambers, or the like.

Typically, these chambers surround a central chamber housing a wafer handling robot. The cluster tool also typically includes a cassette in which multiple wafers are stacked before and after semiconductor fabrication. The wafer handling robot has access to the multiple chambers and the cassette, through ports coupling each chamber and cassette to the central chamber. During operation the wafer handling robot repetitively transports wafers from one chamber to another, or to and from the cassette. Furthermore, the cluster tool forms a sealed environment that is controlled to limit potential contamination of the semiconductors and to ensure that optimal processing conditions are maintained. Examples of cluster tools can be found in U.S. Pat. Nos. 5,955,858, 5,447,409, and 5,469,035, all of which are incorporated herein by reference.

To increase fabrication efficiency, a high throughput of wafers is desirable. A high throughput can be achieved in a number of ways. First, duplicate chambers can be provided. This potential solution, however, substantially increases the cost and complexity of each cluster tool. Second, additional wafer handling robots can be provided in each cluster tool. Again, this solution substantially increases the cost and complexity of each cluster tool. Third, the speed of any individual process can be increased. Although optimization of each process is always being improved upon, each process is typically completed in as short a time as is currently possible. Finally, the handling speed of each wafer by the wafer handling robot can be increased. This solution, however, is subject to a number of criteria, such as: each wafer must be securely grasped or clamped by the wafer handling robot in the minimum amount of time; the clamping of the wafer must be firm, but not overly so, so as not to damage the fragile wafer; the clamping and placement of each wafer must be precise and accurate since any misplacement might negatively impact the process and/or damage the wafer; transfer between chambers, or into or out of the cassette, must be smooth so that the wafer does not undergo any unnecessary stress and in the worst case, if the wafer is dislodged from the clamping mechanism, this condition must be sensed, and the wafer transfer system must be halted; the clamping mechanism must be heat resistant, as some of the processes may expose the clamping mechanism to high temperatures; the clamping mechanism must not introduce any particulates or contaminants into the closed environment that can ultimately damage the wafer or semiconductors (it has been found that particulates as small as the critical dimension or line width of a semiconductor device, currently 0.18 $\mu$m, can damage the integrity of an integrated circuit formed on a wafer); the wafer clamping mechanism should be able to automatically center a misplaced wafer; and finally, the wafer clamping mechanism must not introduce a static electric field into the wafer, which might discharge and damage the semiconductor devices being fabricated.

To maximize system throughput, the wafer handling robot must rotate and extend as fast as possible without causing the clamped wafer to slip during transport. Slip occurs when the robot accelerates the wafer such that its inertia overcomes the clamping force of the clamping mechanism. This causes undesired wafer movement and results in wafer misalignment and particle generation.

Of the abovementioned potential solutions to increasing wafer throughput, increasing the handling speed of each wafer is the most practical and cost effective. Therefore, to address the above criteria, a more robust and better designed wafer clamping mechanism is required.

A number of prior art devices have attempted to clamp the wafer in a way that addresses some or all of the abovementioned criteria. FIGS. 1A, 1B and U.S. Pat. No. 5,955,858, show a bottom view of a wrist assembly 102 of one such prior art device 100 with its bottom cover plate removed. Clamp fingers 108, shown extended from the wrist assembly 102, engage a perimeter of a wafer 104 to clamp the wafer 104 onto a wafer carrying blade 106. The wafer 104 is held between the fingers 108 and a blade bridge 110 under forces applied by a pair of parallelogram springs 112, best seen in FIG. 1B. Parallelogram springs 112 bias the fingers 108 toward the wafer 104.

The wrist assembly 102 is coupled to the distal end of frog-leg type robot arms 114 of a wafer handling robot. During extension of the robot arms 114, i.e., when the robot arms are drawn toward one another, as shown in FIG. 1A, a rotation is imparted on pivots 116, which in turn rotate cogs 118. The cogs 118 in turn engage with the fingers 108 to retract the fingers 108 away from the wafer 104. Therefore, the wafer 104 is released when the robot arms 114 are extended and clamped when the robot arms 114 are retracted. If the fingers were directly attached to the cogs 118 then the clamping force would depend on the motion characteristics of the robot, for example, the speed of extension and retraction of the robot arms 114. In this device, the fingers can be set independently by controlling the stiffness of the parallelogram spring 112.

A drawback of this wrist assembly 102 is that the parallelogram springs 112 are easily deformed by out-of-plane forces, causing the clamping force direction to deviate from the norm. This leads to unreliable clamping and potential particle contamination caused by friction between the fingers and the wafer. Furthermore, the cycle life of the parallelogram springs 112 (approximately 1 year or 10 million spring cycles) has been found to be inadequate. In addition, the wrist assembly 102 does not provide for clamping a wafer that is not centered correctly. If the spring is deformed, the capture pocket, i.e., the total area in which the clamping mechanism can capture a wafer, could easily change, thereby, reducing the tolerance of the wafer handling system to deviations in the position of the wafer during transfer to and from each chamber. It has also been found that manufactured parallelogram springs are highly sensitive to manufacturing defects and mishandling before, during, and after installation, leading to unreliable clamping. Furthermore, the manufacturing process for the spring requires an electropolish step that cannot be controlled reliably. Finally, any kinks in the spring caused by mishandling lead to stress concentration points that reduce the fatigue life of the spring.

A partial bottom view of another prior art clamp wrist assembly 102 with its bottom cover plate partially removed is shown in FIG. 1C and in U.S. Pat. No. 6,155,773. This clamp wrist assembly 120 comprises a lever assembly 122, a flexure member 124, and a pair of clamp fingers 126 that engage a wafer 130. Leaf springs 128 bias the flexure member 124 against the wafer 130. When the clamp wrist assembly 120 is in its extended position, a translational member 132 engages a first lever 134 to retract the fingers from their clamping position. However, this wrist assembly 120 does not clamp a wafer that is not centered correctly. Moreover, space limitations prevent this clamp wrist assembly 120 from being implemented on an opposed dual blade robot.

Finally, a partial bottom view of another prior art wafer holder 140 with its bottom cover plate removed is shown in FIG. 1D and U.S. Pat. No. 5,810,935. Wafer holder 140 includes holding means 142 for holding rounded edges of wafer 144, and an actuating means 146 for operating the holding means 142. Tension springs 148 bias the holding means 142 towards the wafer 144. Not only does the actuating means introduce additional complexity and cost into the system, but it leads to more potential areas of particle generation and potential electrical fields, both of which might damage the wafer.

In light of the above, there is a need for a wafer clamping mechanism that securely clamps a wafer for speedy handling, meets the abovementioned criteria, and addresses the drawbacks presented by the prior art.

SUMMARY OF THE INVENTION

A preferred embodiment of wafer clamping mechanism of the present invention comprises a linkage mechanism and a wafer contact point coupled to the linkage mechanism. The linkage mechanism is preferably coupled near to the distal end of a robot arm. The linkage mechanism preferably comprises a four-bar linkage having: a first link having a first fixed pivot and a first floating pivot distal from the first fixed pivot; a second link having a second fixed pivot and a second floating pivot distal from the second fixed pivot; and a third link having a first coupling pivot rotatably coupled to the fist floating pivot, and having a second coupling pivot rotatably coupled to the second floating pivot. In use motion of the robot arm activates the linkage mechanism, which in turn causes the wafer contact point to clamp a wafer.

Therefore, the above described clamping mechanism reliably increases throughput while reducing cost. The clamping mechanism also provides the benefit of passive wafer centering, versus more costly active center finding methods, thereby eliminating the potential for failure due to variances in wafer placement.

BRIEF DESCRIPTION OF THE DRAWINGS

For a better understanding of the nature and objects of the invention, reference should be made to the following detailed description, taken in conjunction with the accompanying drawings, in which.

Like reference numerals refer to corresponding parts throughout the several views of the drawings.

DETAILED DESCRIPTION OF THE PREFERRED EMBODIMENTS

Figure 1A:
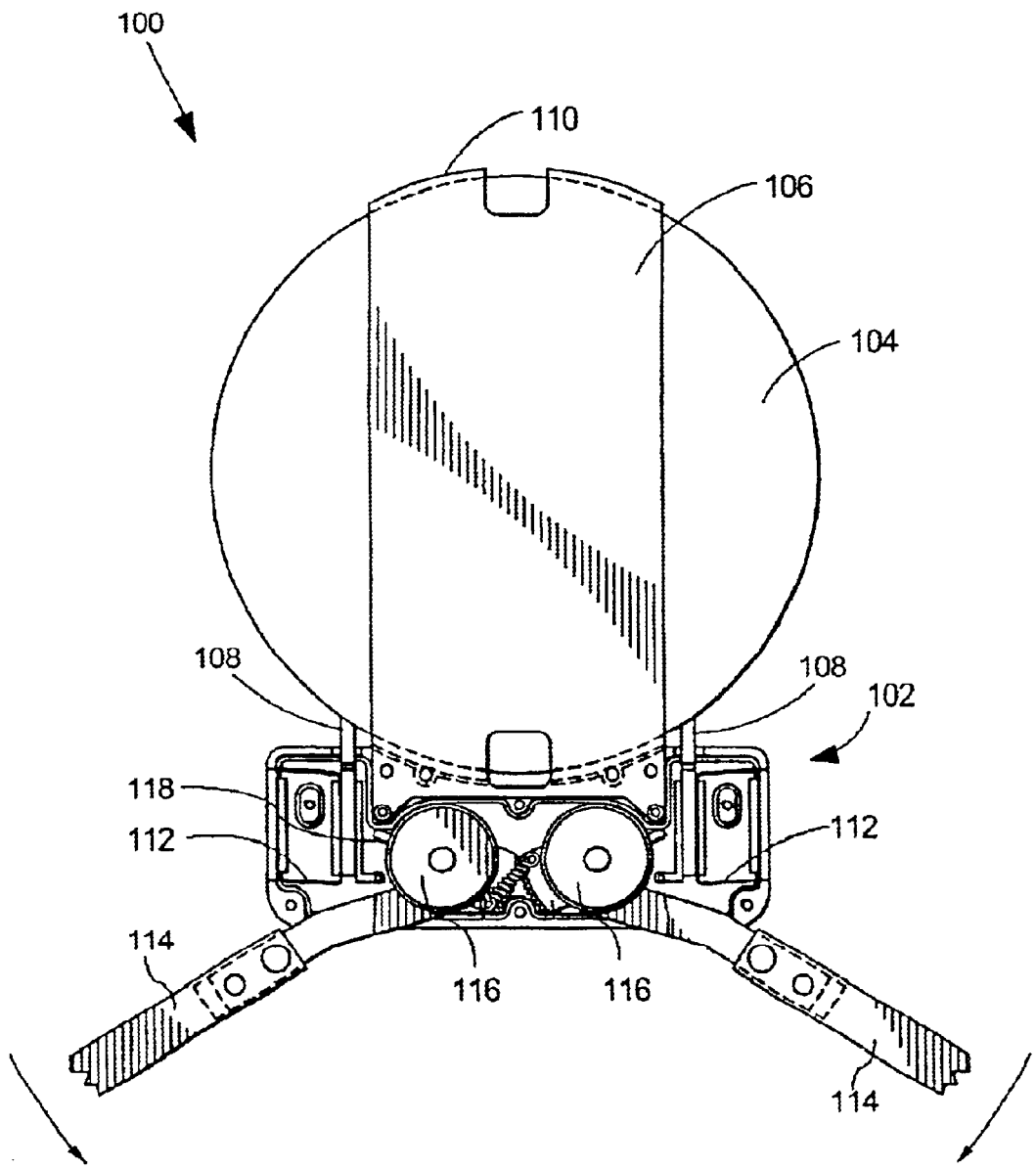
FIGS. 1A and 1B are bottom and isometric views of a prior art wrist assembly.
Figure 1B:
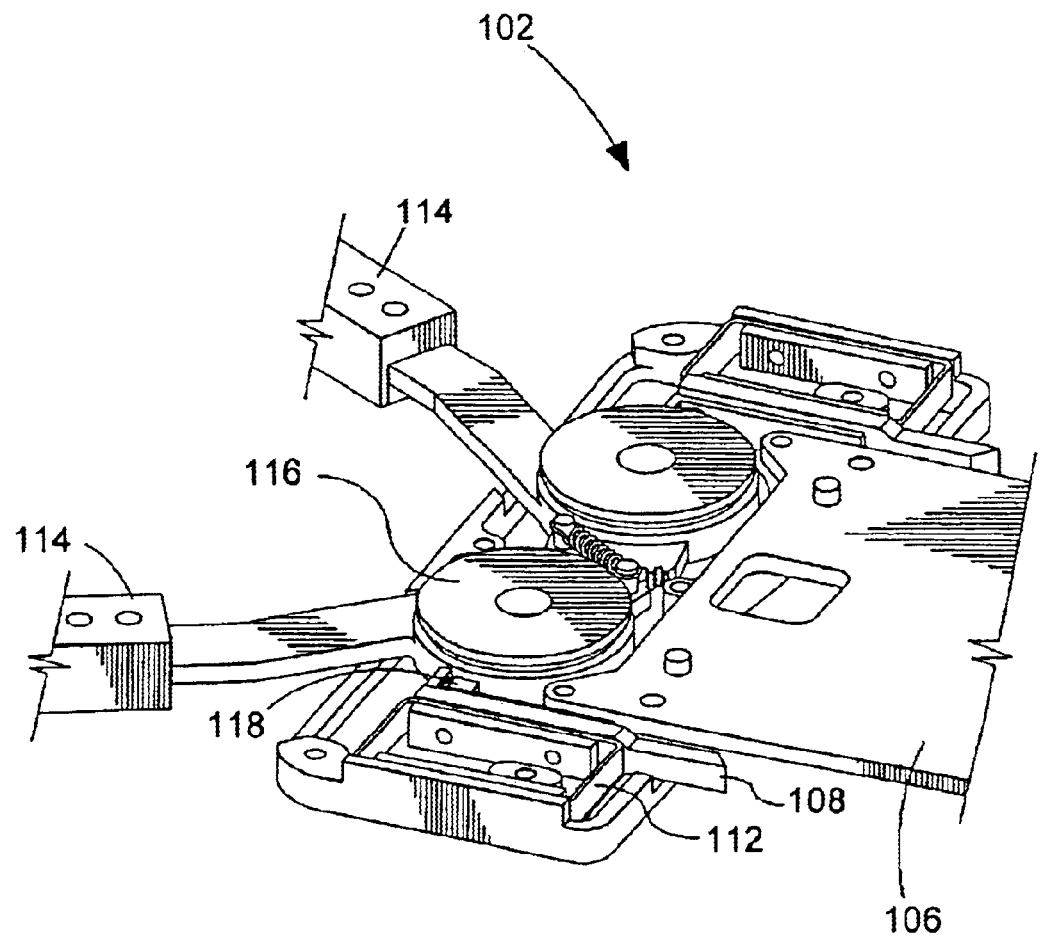
Figure 1C:
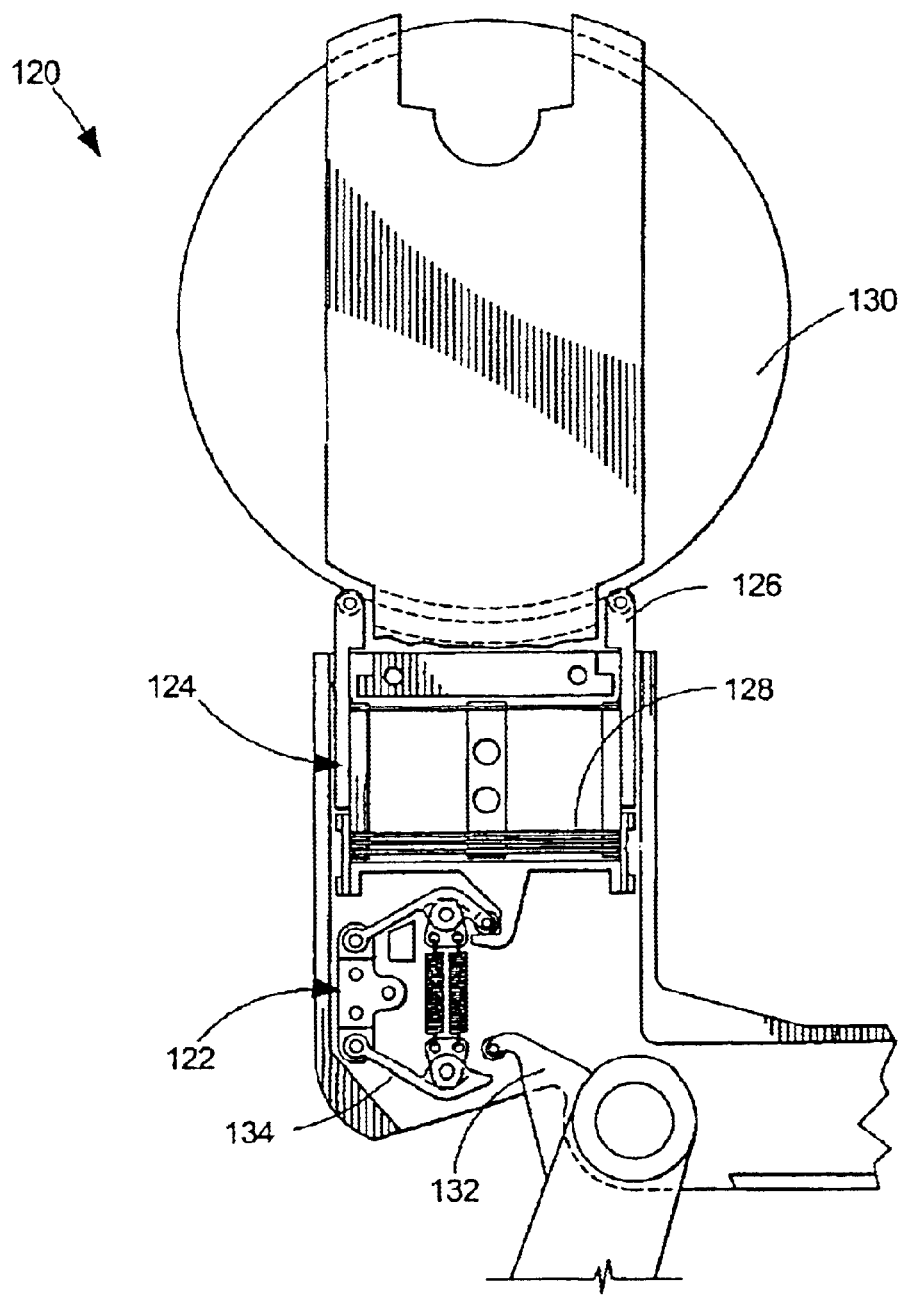
FIG. 1C is a bottom view of another prior art wrist assembly.
Figure 1D:
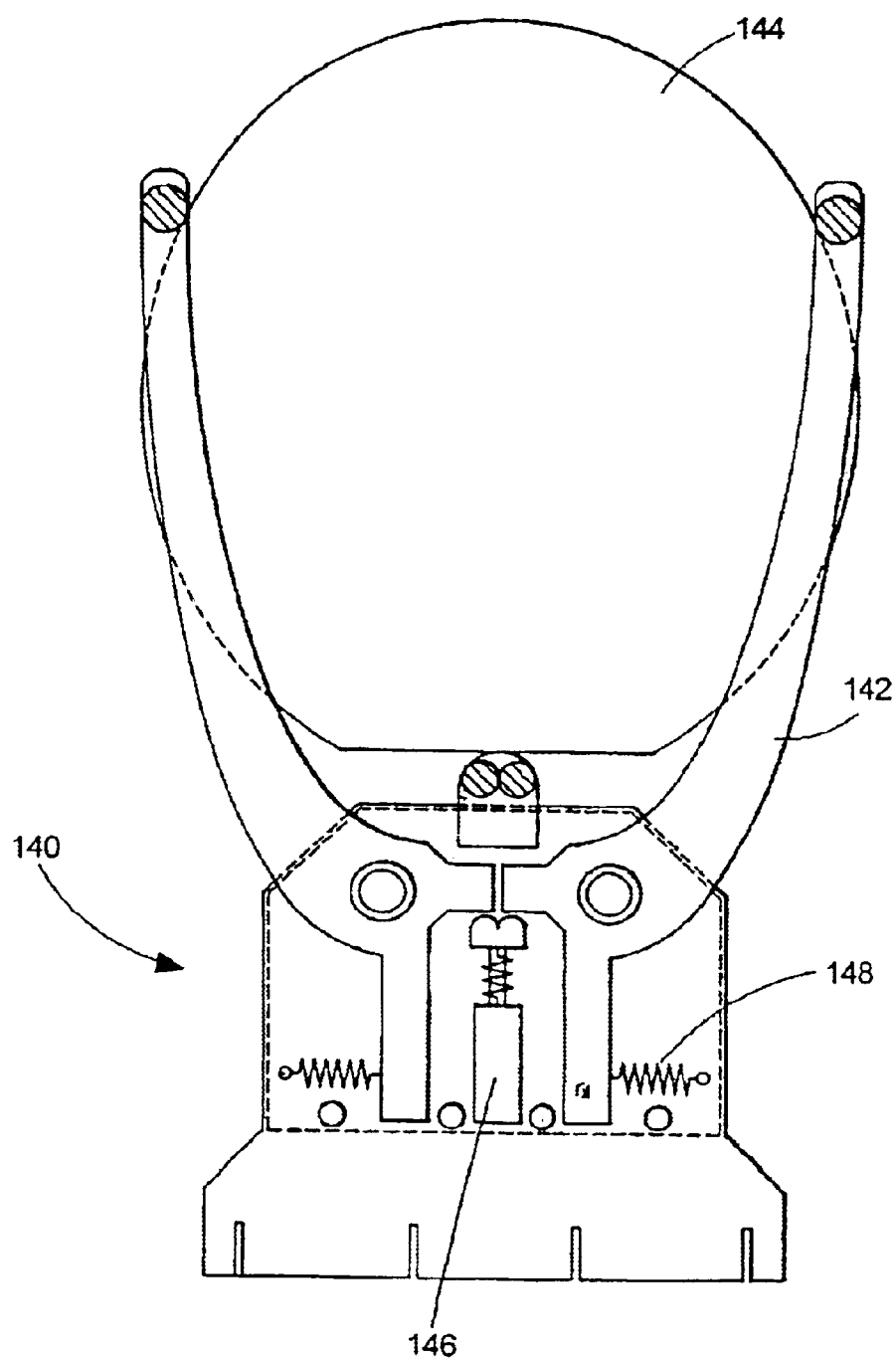
FIG. 1D is a bottom view of yet another prior art wafer holder.
Figure 2:
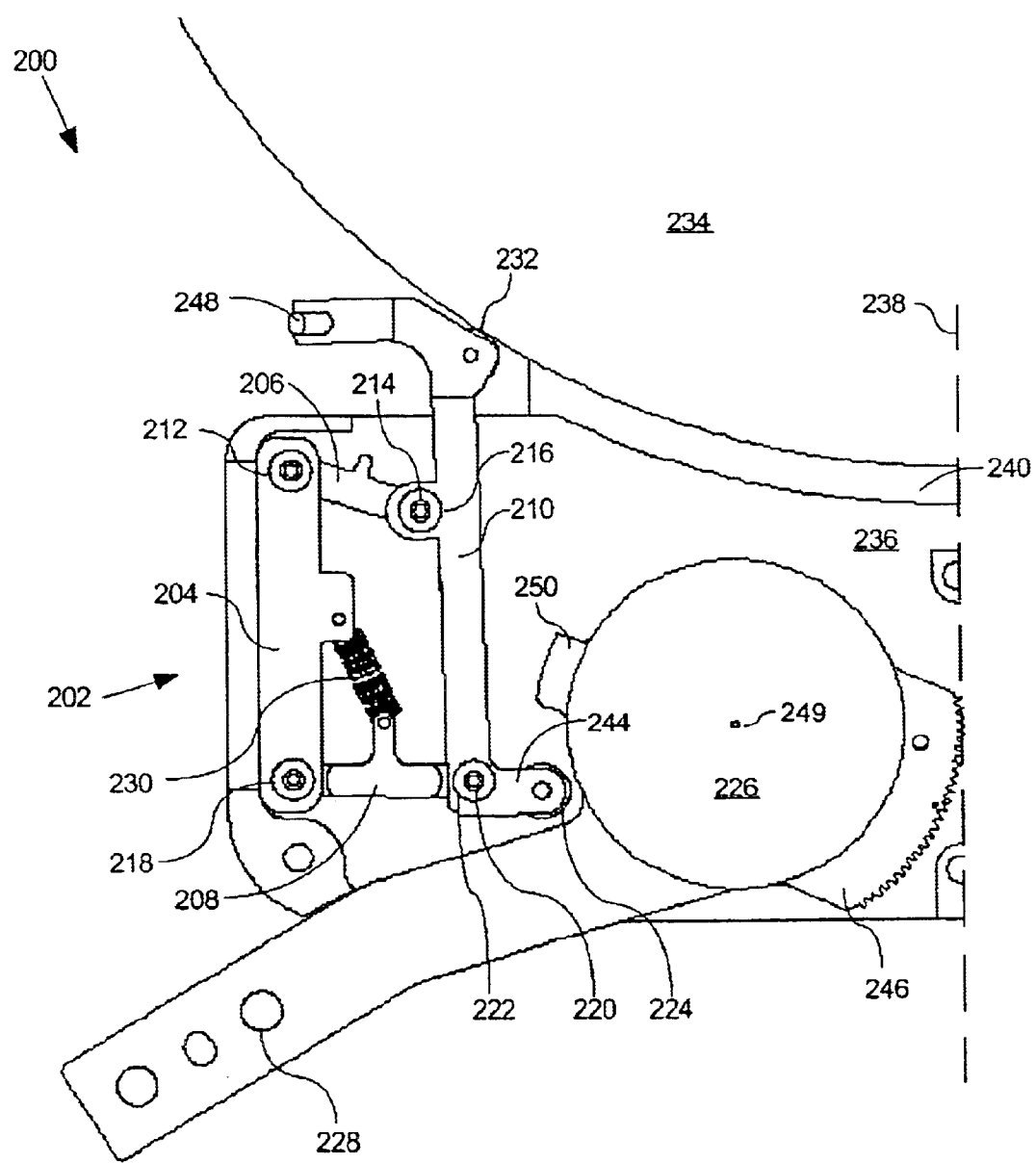
FIG. 2 is a diagrammatic top view of a wafer clamping mechanism with its top cover plate removed, according to an embodiment of the invention.

FIG. 2 is a diagrammatic top view of a portion of a wafer clamping mechanism 200 with its top cover plate removed, according to an embodiment of the invention. The clamping mechanism 200 securely clamps a wafer 234, positioned on a wafer carrying blade 240, to the distal end of one or more robot arms 228 of a wafer handling robot (not shown). The robot arm 228 shown is preferably one side of a frog-leg type robot arm of a wafer handling robot similar to that disclosed in U.S. Pat. No. 5,955,858 (incorporated herein). The clamping mechanism 200, also includes a mirror reflection of the elements of FIG. 2 about line 238. The complete clamping mechanism is shown in FIG. 3.

The distal end of the robot arm 228 is rotatably coupled to a wrist 236 that is preferably located near the distal end of the robot arm 228. The clamping mechanism 200 includes a linkage mechanism 202 partially anchored to the wrist 236. In a preferred embodiment, the linkage mechanism 202 is a four bar linkage, which is a linkage consisting of an assemblage of four links which are pinned together head to tail in a closed loop.

The linkage mechanism 202 comprises an elongate first link 206 having a first fixed pivot 212 and a first floating pivot 214. The first fixed pivot 212 and first floating pivot 214 are preferably positioned near opposing ends of the first link 206. The first fixed pivot 212 is rotatably anchored to the wrist 236. In a preferred embodiment, the first fixed pivot 212 is rotatably anchored to a first end of a ground link 204 that is anchored to the wrist 236.

The linkage mechanism 202 also comprises an elongate second link 208 having a second fixed pivot 218 and a second floating pivot 220. The second fixed pivot 218 and second floating pivot 220 are preferably positioned near opposing ends of the second link 208. The second fixed pivot 218 is rotatably anchored to the wrist 236. In a preferred embodiment, the second fixed pivot 218 is rotatably anchored to a second end of a ground link 204 that is anchored to the wrist 236. The first link 206 and second link 208 are preferably rocker links that are configured to oscillate between two limit positions, but preferably cannot rotate continuously through 360 degrees.

The linkage mechanism 202 additionally comprises an elongate third link 210 coupling the first link 206 to the second link 208. The third link 210 includes a first coupling pivot 216 rotatably coupled to the first floating pivot 214, and a second coupling pivot 222 rotatably coupled to the second floating pivot 220. In a preferred embodiment, the first floating pivot 214 and the first coupling pivot 216 are one and the same. Likewise, in a preferred embodiment, the second floating pivot 220 and the second coupling pivot 222 are one and the same.

Furthermore, the third link 210 is preferably a floating link whose movement is only constrained by the rotation of the first floating pivot 214 about the first fixed pivot 212, and the second floating pivot 220 about the second fixed pivot 218.

The clamping mechanism 200 also includes a wafer contact point 232 coupled to the linkage mechanism 202. In use, motion of the linkage mechanism 202 causes the wafer contact point 232 to contact the wafer 234, thereby clamping the wafer 234 between the wafer contact points 232 of two clamping mechanisms 200 and a bridge 302 (FIG. 3) located at the distal end of a wafer carrying blade 240. The wafer contact point 232 is preferably coupled to a portion of the third link 210 that extends axially beyond said first coupling pivot 216.

The third link 210 also preferably includes an activation contact point 224 near the second coupling pivot 222. The activation contact point 224 is preferably positioned at a distal end of an elongate lip 244. The lip 244 preferably extends substantially perpendicular to the third link 210, near the second coupling pivot 222.

A biasing mechanism 230 is coupled to the linkage mechanism 202. The biasing mechanism 230 urges the linkage mechanism 202 and hence the wafer contact point 232, against the wafer 234. The biasing mechanism 230 is preferably a simple extension spring, which can be customized for different applications by selecting various spring stiffnesses. These springs are available off-the-shelf and typically have a fatigue life of over 10 million cycles if the restoring force at full deformation is under 45% of the spring's UTS (Ultimate Tensile Strength). The biasing mechanism 230 is preferably coupled on its one end to the ground link 204 and on its other end to the second link 208, biasing the second link 208 to rotate toward the wafer 234.

The end of the robot arm 228 is preferably coupled to a cam 226. The cam 226 in turn is rotatably coupled to the wrist 236 allowing the cam 226 to rotate about a cam pivot point 249. A cog 250 extends radially from the perimeter of the cam 226 so that the cog 250 rotates together with the cam 226. The cam 226 is also coupled to a gear 246 such that opposing gears of opposing clamping mechanisms 200 intermesh to assure an equal and opposite angular rotation of each cam 226. This ensures that the blade and wafer are accurately extended by the robot arms, i.e., that the wrist is kept substantially perpendicular to the direction of extension and retraction of the robot arms. To eliminate play between these two gears, caused by a loose intermeshing of the gears, a weak spring (not shown) may be extended between a point on one gear to a point on the other gear such that the spring tension lightly rotates these two gears in opposite directions until light contact between these gears is produced.

The inter-relationship between the lengths of the ground 204, first 206, second 208, and third 210 links are selected such that in use the wafer contact point 232 follows a predetermined locus. Movement of the wafer from a predetermined release position in a chamber can occur due to sudden dechucking, a surge in backside cooling gas pressure, or wafer lift vibrations while the wafer is still in a process chamber. To address this problem, the effective capture range of the clamping mechanism is set at approximately 0.125 inch (3.175 mm) from the nominal wafer placement location. In other words, if a wafer were to move less than 0.125 inch any direction, the clamp wrist is still able to capture the wafer in its pocket, thereby recentering, and clamping the wafer. The increased capture area adds robustness of the clamping mechanism in the event there is abnormal wafer movement in a process chamber.

In most cases, wafer movement in a process chamber is physically constrained to less than the effective capture rage of the clamping mechanism. However, for the remaining cases where the wafer movement is completely unconstrained, a sensing system can be used to detect a wafer out-of-pocket condition, preventing handling faults or wafer breakage. A suitable sensing system is disclosed in U.S. Pat. No. 6,166,509, which is incorporated herein by reference. The sensing system includes a visual identification marker 248, which is preferably located near to the wafer contact point 232. The visual identification marker 248 is used by the system to determine the location of the wafer contact point 232. This allows the system to sense if the wafer is not properly clamped by detecting if the visual identification marker 248 moves beyond a threshold position. The location of the visual identification marker 248 is also used to calculate the center of the wafer so that the movement of the robotic arms 228 can be controlled to accurately position the wafer in a process chamber or the like. This clamping mechanism, hence provides a benefit of passive wafer centering, versus more costly active center-finding methods.

Each pivot 212, 214, 218, 220 preferably comprises a bearing and a pin. The bearing in turn preferably comprises multiple balls positioned within races, where one link is attached to the races of the bearing and the other link to the pin. The pin and races are preferably made from stainless steel, such as SST 440C, while the bearing is preferably made from either stainless steel or a ceramic, such as silicon nitride. Each link is preferably made from aluminum.

Figure 3B:
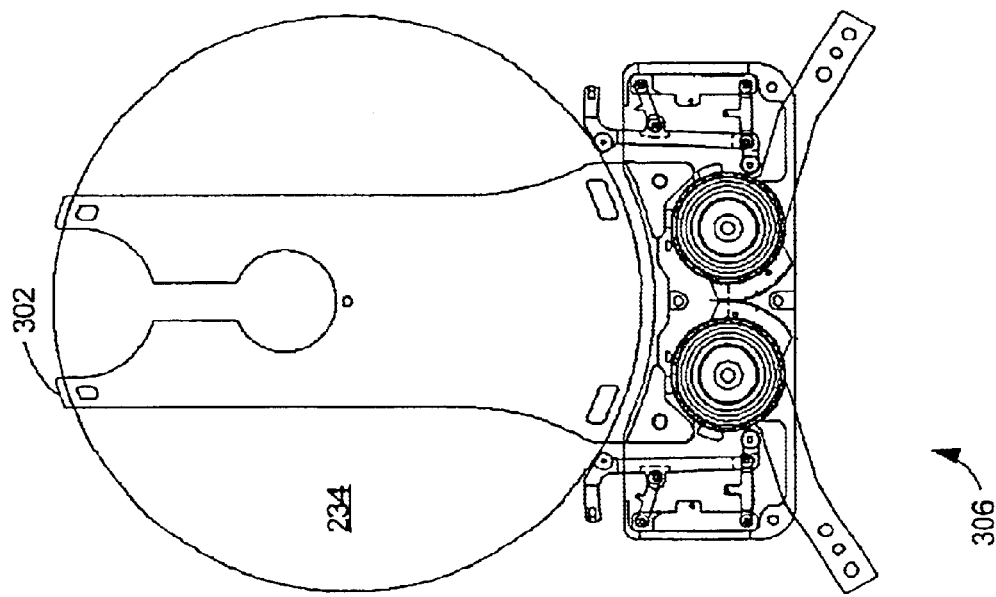
FIGS. 3A and 3B are top views of the wafer clamping mechanism shown in FIG. 2 in both an extended position and a retracted position, respectively.
Figure 3A:
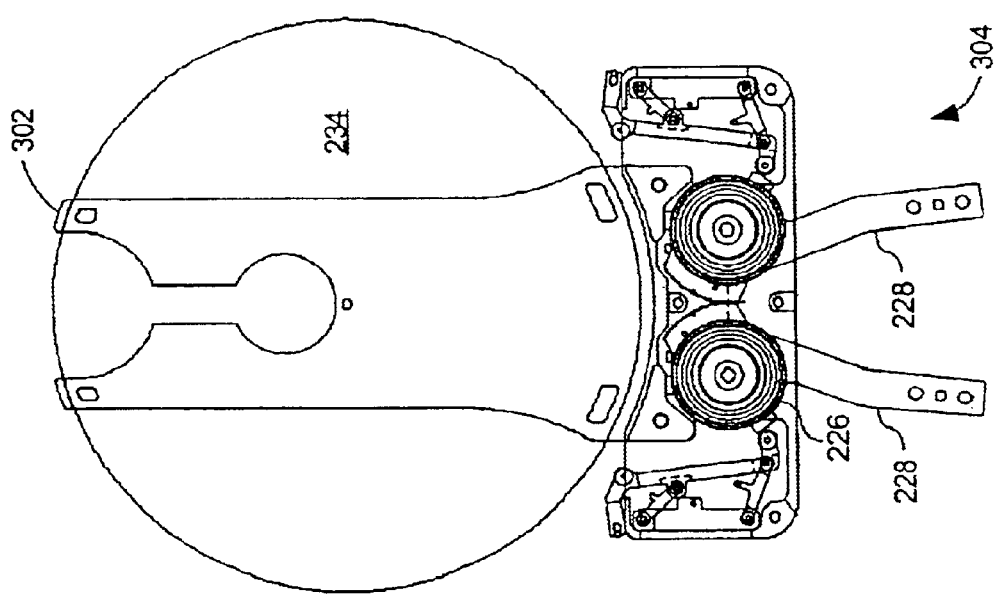

FIGS. 3A and 3B are top views of the wafer clamping mechanism 200 shown in FIG. 2 in both an extended 304 position and a retracted 306 position, respectively. In use, when the robot arms 228 are extended 304, i.e., when the frog-leg type robot arms 228 are rotated towards one another, the cams 226 rotate causing each cog 250 (FIG. 2) to contact its respective activation contact point 224 (FIG. 2) and, thereby, retract the wafer contact point 232 (FIG. 2) from the wafer 234. Therefore, when the robot arms 228 are extended 304, the wafer 234 can be released in a chamber or cassette. Similarly, when the robot arms 228 are retracted 306, i.e., when the frog-leg type robot arms 228 are rotated away from one another, the wafer 234 is clamped by the wafer clamping mechanism 200 (FIG. 2) so that the wafer 234 can be transferred to a different chamber or cassette. The timing of the release or clamp can be adjusted based on link lengths, transfer chamber size, etc.

Figure 4:
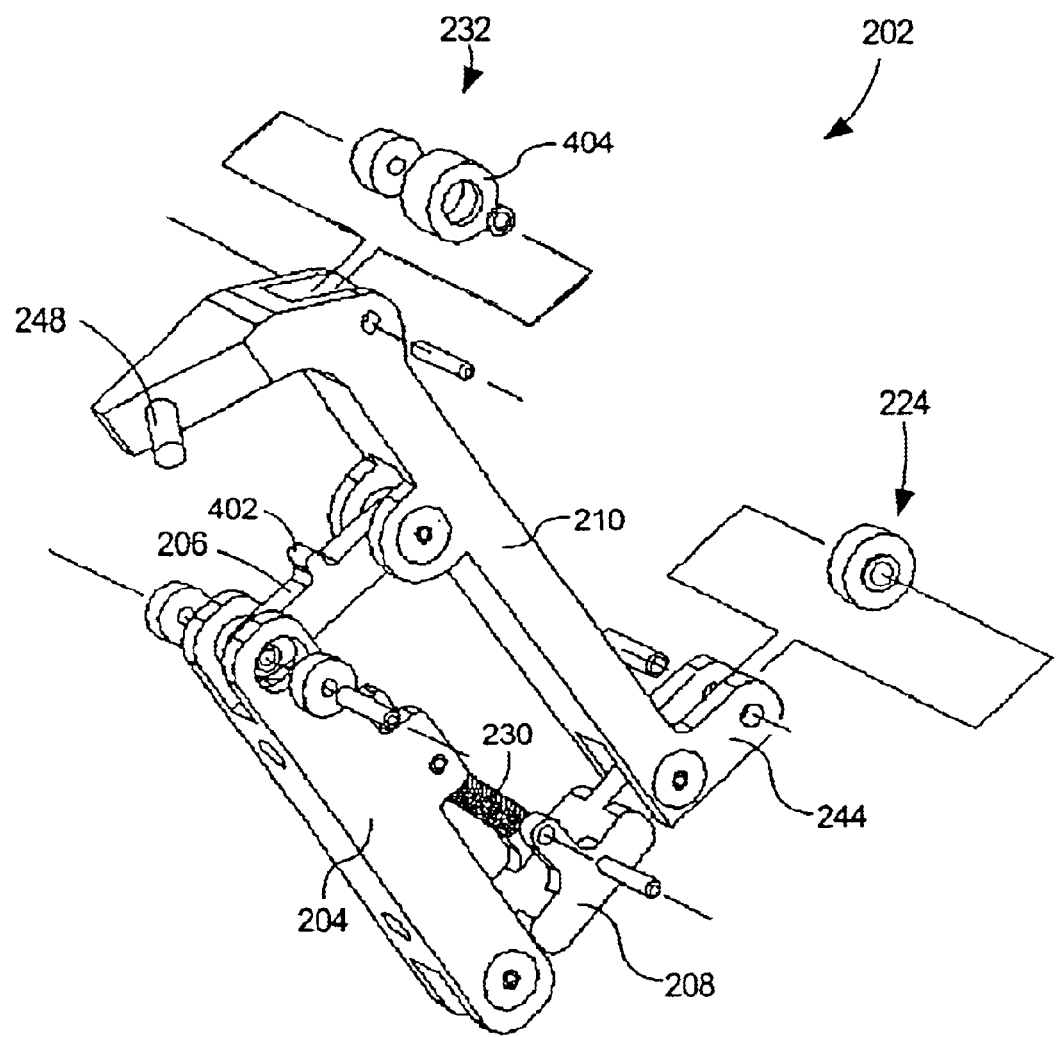
FIG. 4 is a exploded view of the linkage mechanism of FIG. 2.

FIG. 4 is a exploded view of the linkage mechanism 202 of FIG. 2. Because many processes are sensitive to metal contamination, and the wafer contact point 232 can potentially shed particles onto the wafer, the wafer contact point 232 preferably includes a bearing with a sleeve 404 around it. This sleeve can be selected from a passive material so as not to react with process gases and discharge by-products or particulates onto the wafer. Moreover, a non rotatable contact point 232 may cause the wafer to roll on the fingertip rather than slide on it. The net effect of this rolling motion is to displace the wafer center from the blade center, causing an incomplete clamp.

The wafer contact point 232 is preferably removable to allow various linkage mechanisms 202 to use wafer contact points 232 made from different materials. For example, a high temperature process could use a quartz wafer contact point, while a low temperature process could use a wafer contact point made from Delrin or aluminum. The materials chosen for the wafer contact point are based on characteristics, such as Coefficient of Thermal Expansion (CTE), corrosion resistance, and machinability constraints.

In a preferred embodiment, the sleeve 404 is preferably titanium. Alternatively, the entire bearing and sleeve combination can be ceramic, which is significantly more resistant to corrosive chemicals. These bearings are preferably run dry, i.e., without lubricant, because outgassing of the bearing lubricant close to the wafer edge leads to wafer contamination. Therefore, a hybrid bearing is preferred. A suitable hybrid bearing for medium temperature (up to 450° C.) processes includes Si3N4 balls, and 440C Stainless Steel races, run with minimal lubricant. Full ceramic bearings (Si3N4 balls and races) are typically not used as they cost ten times more than the hybrid bearings. Since the standard ball separators, such as cages, crowns, retainers, etc., are not corrosion resistant and the loads at the bearing axis are small, a full complement shielded radial bearing configuration is preferred.

The activation contact point 224 as well as each of the pivot points (212, 214, 216, 218, 220, and 222 of FIG. 2) do not have similar sleeves or bearings to those described above, as off-the-shelf bearings can be used since these bearings are not in close proximity to the wafer.

The linkage mechanism 202 preferably also includes built-in hard-stops 402 that restrict the range of motion of the links, thereby, restricting the maximum deformation of the biasing mechanism 230.

Figure 5B:
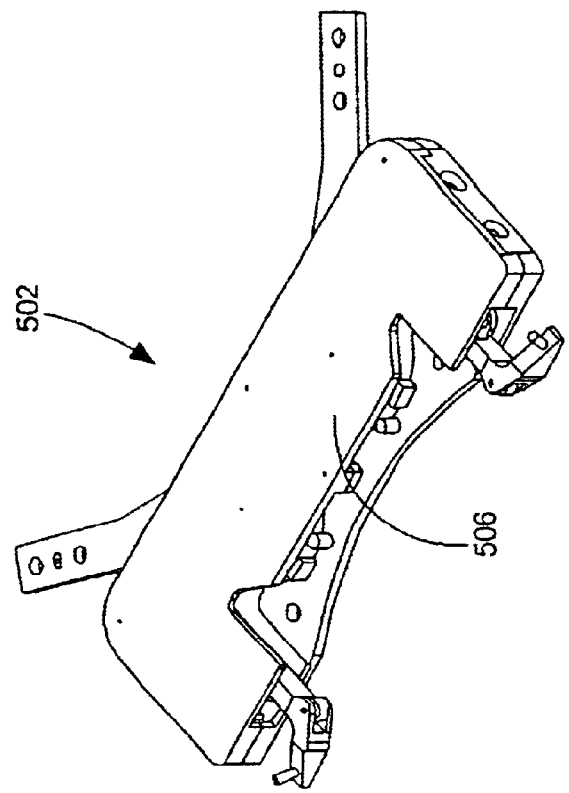
FIGS. 5A and 5B are an exploded view and an assembled view of the wrist 236 of FIG. 2, respectively.
Figure 5A:
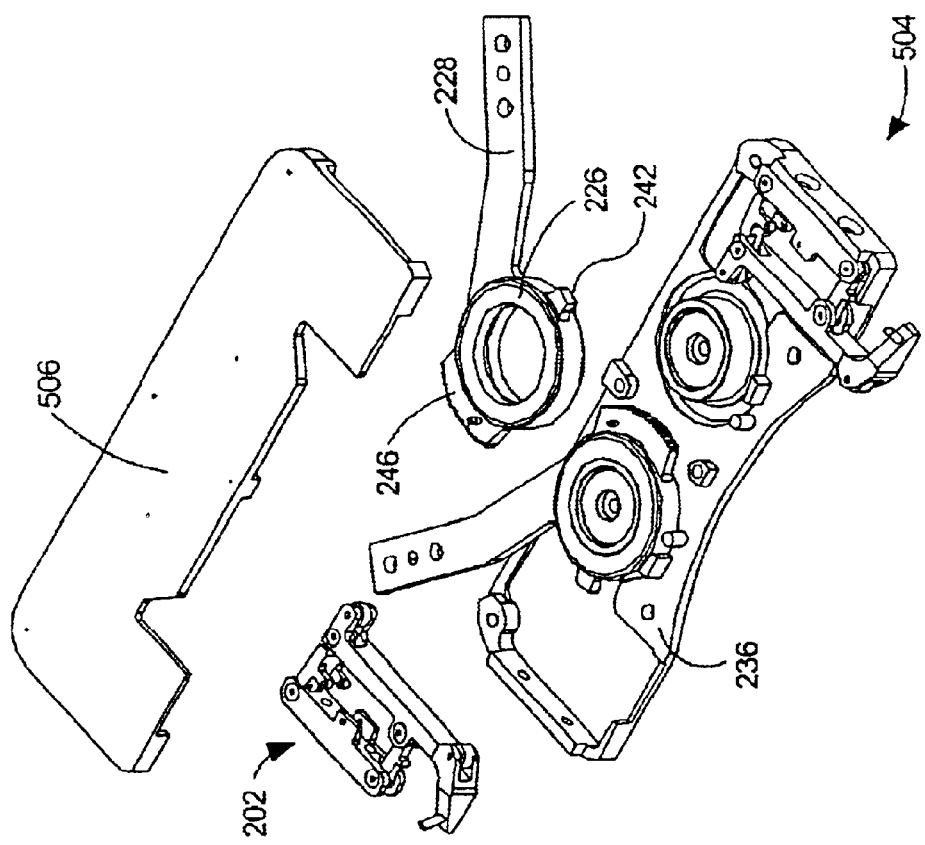

FIGS. 5A and B are an exploded view 504 and an assembled view 502 of the wrist 236 of FIG. 2, respectively. As can be seen, two linkage mechanisms 202 are positioned within the wrist 236. The cog 250 on the cam 226 is also shown. A cover 506 is secured to the wrist 236 to enclose the aforementioned components.

Figure 6:
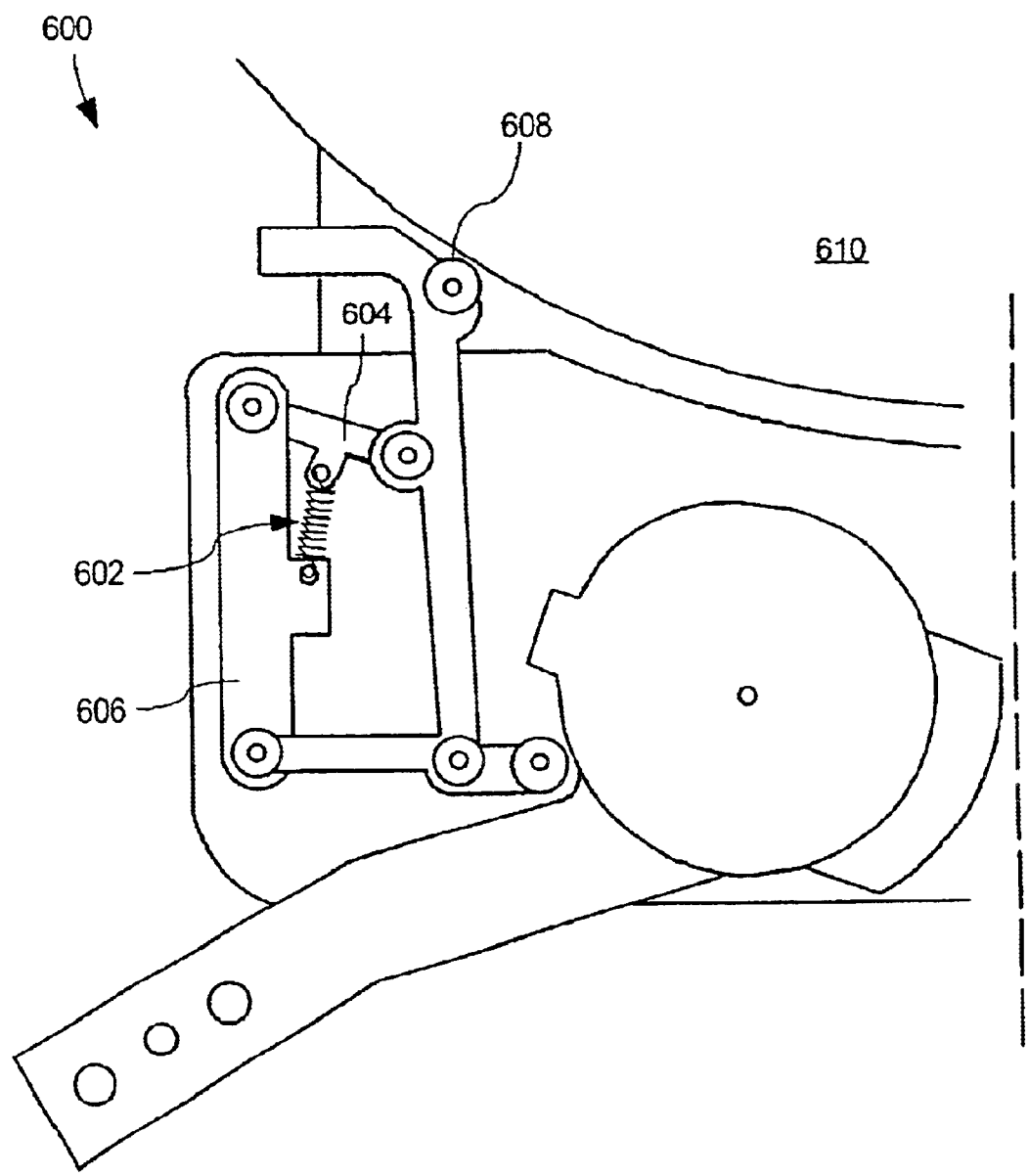
FIG. 6 a diagrammatic top view of another wafer clamping mechanism with its top cover plate removed, according to another embodiment of the invention.

FIG. 6 a diagrammatic top view of another wafer clamping mechanism 600 with its top cover plate removed, according to another embodiment of the invention. In this embodiment, a biasing mechanism 602 is coupled between a first link 604 and a ground link 606. In this embodiment, the biasing mechanism 62 is preferably a compression spring. The biasing mechanism 602 biases a wafer contact point 608 into contact with a wafer 610.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Furthermore, the order of steps in the method are not necessarily intended to occur in the sequence laid out. It is intended that the scope of the invention be defined by the following claims and their equivalents.

What is claimed is:

1. A wafer clamping mechanism, comprising:
   a wrist configured to be coupled to a distal end of a robotic arm;
   a linkage mechanism, comprising:
   a first link having a first fixed pivot rotatably coupled to said wrist, and a first floating pivot remote from said first fixed pivot;
   a second link having a second fixed pivot rotatably coupled to said wrist, and a second floating pivot remote from said second fixed pivot; and
   a third link having a first coupling pivot rotatably coupled to said first floating pivot and having a second coupling pivot rotatably coupled to said second floating pivot; and
   a wafer contact point coupled to said linkage mechanism, such that in use motion of said linkage mechanism causes said wafer contact point to contact a wafer.

2. The wafer clamping mechanism of claim 1 wherein said first and second links are rocker links that are configured to oscillate between two limit positions.

3. The wafer clamping mechanism of claim 1 wherein said third link is a floating link.

4. The wafer clamping mechanism of claim 1 wherein said linkage mechanism is a four-bar linkage, further comprising a ground link between said first fixed pivot and said second fixed pivot.

5. The wafer clamping mechanism of claim 1 wherein said wrist is further coupled to a wafer carrying blade.

6. The wafer clamping mechanism of claim 5 further comprising a clamping activation mechanism that actuates said linkage mechanism when said robotic arm is in a predetermined position.

7. The wafer clamping mechanism of claim 5 further comprising a biasing mechanism coupled to said linkage mechanism, said biasing mechanism biasing said wafer contact point towards said wafer carrying blade.

8. The wafer clamping mechanism of claim 7 wherein said biasing member is coupled to said second link.

9. The wafer clamping mechanism of claim 6 wherein said clamping activation mechanism retracts said wafer contact point away from said wafer carrying blade when said robotic arm is in its extended position.

10. The wafer clamping mechanism of claim 5 wherein said third link includes an activation contact point near said second floating pivot, where said activation contact point is configured to engage with said clamping activation mechanism.

11. The wafer clamping mechanism of claim 10 wherein said activation contact point is roller.

12. The wafer clamping mechanism of claim 11 wherein said activation contact point is an at least partly ceramic bearing.

13. The wafer clamping mechanism of claim 1 wherein said third link includes a portion thereof that extends axially beyond said first coupling pivot, and where said contact point is coupled to said portion.

14. The wafer clamping mechanism of claim 1 wherein said contact point is a roller.

15. The wafer clamping mechanism of claim 14 wherein said roller includes an at least partly ceramic bearing.

16. The wafer clamping mechanism of claim 1 further comprising an additional linkage mechanism and an additional wafer contact point.

17. A wafer clamping mechanism, comprising:
- a robot arm;
- a wrist located near the a distal end of said robot arm;
- a wafer carrying blade coupled to said wrist; and
- at least two four-bar linkage mechanisms coupled to said wrist, said four-bar linkage mechanisms each including four rigid linkage members and automatically clamping a wafer onto said blade when said robot arm is in its retracted position.

18. The wafer clamping mechanism of claim 17, further comprising:
- a cam coupled to said distal end of said robot arm and rotationally coupled to said wrist;
- an additional robot arm; and
- an additional cam coupled to an end of said additional robot arm, and rotationally coupled to said wrist, where said cams are configured to engage with said at least two four-bar linkage mechanisms to clamp and release said wafer onto said wafer carrying blade.

19. A wafer clamping mechanism, comprising:
- a robot arm;
- a wrist located near a distal end of said robot arm;
- a wafer carrying blade coupled to said wrist;
- at least two four-bar linkage mechanisms coupled to said wrist, said four-bar linkage mechanisms automatically clamping a wafer onto said blade when said robot arm is in its retracted position;
- a cam coupled to said distal end of said robot arm and rotationally coupled to said wrist;
- an additional robot arm; and
- an additional cam coupled to an end of said additional robot arm, and rotationally coupled to said wrist, where said cams are configured to engage with said at least two four-bar linkage mechanisms to clamp and release said wafer onto said wafer carrying blade, and
- wherein said cam and said additional cam are configured to transfer equal and opposite rotary motion between one another.

* * * * *